Dec. 13, 1966 F. GROSSOEHME 3,292,050

MOUNTING OF SOLID STATE ELECTRONIC COMPONENTS

Filed Aug. 19, 1965

INVENTOR.
FLOYD GROSSOEHME
BY
ATTORNEY

United States Patent Office 3,292,050
Patented Dec. 13, 1966

3,292,050
MOUNTING OF SOLID STATE ELECTRONIC COMPONENTS

Floyd Grossoehme, Cincinnati, Ohio, assignor to General Electric Company, a corporation of New York
Filed Aug. 19, 1965, Ser. No. 480,992
3 Claims. (Cl. 317—100)

The present invention relates to improvements in mounting solid state electronic components and more particularly to improved means for mounting dual transistor assemblies employed in direct current operational amplifiers.

Direct current differential operational amplifiers have found wide acceptance for many applications because of their stability and the high gain provided thereby. Various circuits have been devised based on the use of an amplification stage wherein there is a differential input to two transistors, as may be ascertained from the publication "Differential Amplifiers," R. D. Middlebrook (John Wiley & Sons). One of the recognized problems in such circuits is that the amplification parameters of the two transistors in a given stage must be equal, otherwise a false output is obtained. One of the parameters affecting the amplification factor is temperature. This has led to the use of dual transistor assemblies wherein matched resistors are mounted in a hermetically sealed can. While such an assembly is satisfactory for many purposes, it fails to eliminate or satisfactorily minimize false outputs in the amplifier where the physical components are subject to sharp or rapid changes in ambient temperature.

The problems of minimizing false outputs or errors due to changes in ambient temperature are further increased by the fact that it is necessary or desirable that the circuit components be encapsulated in a potting compound. While the potting compound is not exactly a thermal insulator, nonetheless sufficient temperature gradients are frequently introduced in the encapsulation, or made more pronounced, which result in temperature variations between the two transistor elements with a resultant error signal being generated until the temperature of the two elements is equalized.

Accordingly, one object of the present invention is to overcome these problems and to minimize, if not eliminate, error signals resulting from changes in the ambient temperature of the circuit components for direct current differential operational amplifiers and particularly the dual transistor assembly thereof.

In a broader sense the object of the invention is to minimize, if not eliminate, false or erroneous outputs from a plurality of solid state electronic components as a result of temperature variations therebetween.

The present invention, in its more specific aspects, is characterized by improved means for mounting a standard dual transistor assembly which comprises a pair of matched transistor chips that are mounted on an insulative substrate usually formed of ceramic or glass. Leads extend through this substrate and are connected to the active components of the transistor chips. The substrate is telescoped into the lower end of an inverted can which is spaced from the conductive elements mounted on the substrate and bonded thereto.

An inverted cap is telescoped over the can and a nut threaded thereto. The cap and the nut have inwardly projecting lips which clamp the flange of the can and hold it in spaced relation to the interior of the cap. The height of the lip on the cap is such that it lies approximately no higher than the upper level of the substrate. The nut, in turn, rests on a printed circuit board to which the transistor leads are connected to function properly in a differential operational amplifier. These elements are then encapsulated in a potting compound.

With the described arrangement any temperature gradients in the potting compound or temperature gradients otherwise transmitted to the aluminum cap are quickly equalized around the perimeter of the can flange, and little or no temperature differential is transmitted to the walls of the can which could then cause a temperature differential between the two transistor chips.

The above and other related objects and features of the invention will be apparent from a reading of the following description of the disclosure found in the accompanying drawing and the novelty thereof pointed out in the appended claims.

Figures 1, 2:
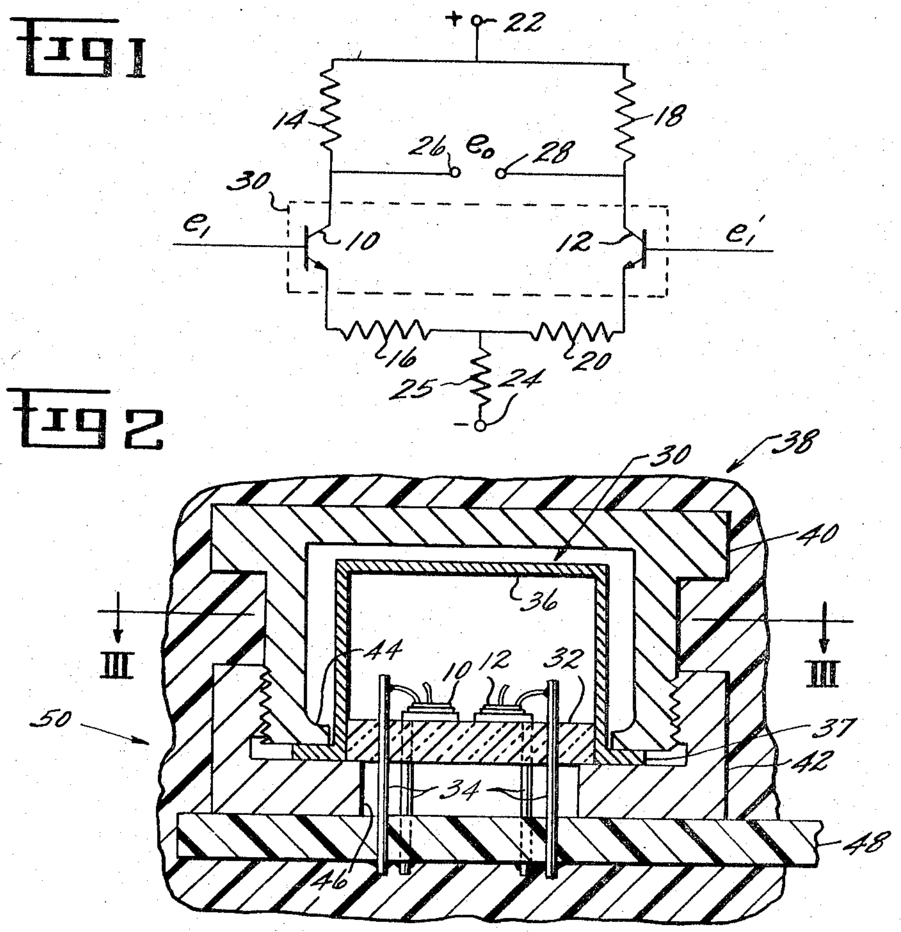
FIGURE 1 is a schematic diagram of a simplified differential amplifier circuit.
FIGURE 2 is a view in section of the mounting means for a dual transistor assembly indicated in FIGURE 1.

FIGURE 1 illustrates a simplified direct current differential operational amplifier circuit. This circuit comprises a pair of transistors 10 and 12 which are respectively connected in series with resistors 14, 16 and 18, 20 across the positive and negative terminals 22 and 24 of a direct current power supply (not shown) with a common resistor 25, providing a coupling to the negative terminal.

Input signals $e_1$ and $e_1'$ imposed respectively on the bases of the transistors 10 and 12 develop an output $e_o$ across terminals 26 and 28. As has been indicated, this is simply an exemplary circuit, and variations and refinements thereof are known to those skilled in the art, as indicated in the above-referenced publication.

Figure 3:
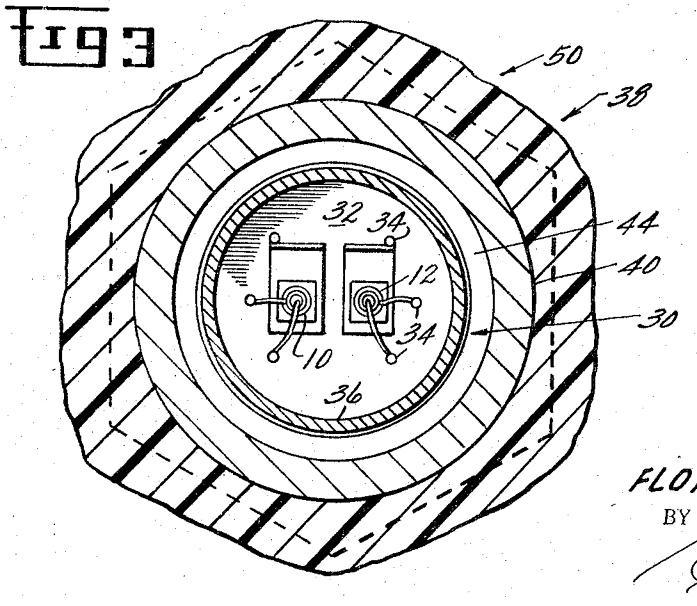
FIGURE 3 is a section taken on line III—III in FIGURE 2.

One of the basic problems involved in such circuits is that the amplification parameters of the transistors 10 and 12 must be identical or essentially so. To this end techniques have been developed for selecting matched pairs of transistors and packaging them in a dual transistor assembly 30 which is shown in greater detail in FIGURES 2 and 3. The transistor elements, commonly referred to as transistor chips, 10 and 12 are mounted on a substrate 32 which is commonly formed of an insulative material such as ceramic or glass. Electrical leads 34 extend through the substrate and are respectively connected to the reactive components of the transistors 10 and 12, namely the collector base and emitters thereof. A metal cap 36 is telescoped over the substrate 32 and is bonded thereto as are the leads 34 so that the transistor chips 10 and 12 are disposed in a hermetically sealed chamber.

The dual transistor assembly 30 is next mounted in a thermal protective unit 38 which comprises a cap 40 and a nut 42 threaded onto its lower end. Both are preferably formed of a material having high thermal conductivity such as aluminum which is also preferred for minimum weight. The cap 40 has an inwardly propecting lip 44 at its base which approximates and is slightly larger than the body diameter of the can 36, thereby centrally locating the can 36 within the cap 40. The nut 42 has an inwardly projecting lip 46 which clamps the flange 37 of the can 36 against the lip 44, thereby positively locking the dual transistor assembly in the thermal protective unit 38. It will be noted that the upper level of the lip 44 is preferably disposed no higher than and preferably below the upper level of the substrate 32, and that the interior walls of the cap 40 are spaced a substantial distance from the can 36. A minimum spacing of .010 inch is preferred.

The thermal protective unit 38 is positioned on a printed circuit board 48 as the leads 34 are inserted through appropriate openings therein and electrically connected thereto by the usual soldering method of attaching components to a printed circuit board to appropriately connect the transistors 10 and 12 in the fashion illustrated in FIGURE 1.

Described circuit elements are then encapsulated in potting compound indicated by reference character 50. The potting compound may be of any known composition such as a cured epoxy resin loaded with aluminum oxide filler.

The described mounting arrangement is highly effective in preventing temperature differentials between the transistor chips 10 and 12. Thus it will be noted that if there is a thermal gradient between the portions of the potting compound 50 on the right-hand and left-hand sides of the thermal protective unit, the temperature change, say a temperature increase, transmitted to the cap 40 and nut 42 on the right-hand side, will very quickly be transmitted to all portions thereof due to their high thermal conductivity. It will further be noted that any temperature differential which may temporarily exist between the opposite walls of the cap 40 will have a minimum influence in creating a temperature differential in the opposite or opposed walls of the can 36, inasmuch as these surfaces are spaced a substantial distance apart so that there will be no heat transfer by conduction and the heat transfer by radiation will be minimal. It will further be noted that the lip 44 being below the surface of the substrate 32 provides a very minimum heat flow path between the cap 40 and the can 36 which might result in a temperature differential in the can 36 or substrate 32 which would cause the undesirable result of a temperature differential.

The described arrangement may also be advantageously employed to maintain other multiple solid state electronic components at precisely equal temperatures. This and other variations of the preferred embodiment herein described will be apparent to those skilled in the art within the spirit of the present invention whose scope is to be derived from the following claims.

Having thus described the invention, what is claimed as novel and desired to be secured by Letters Patent of the United States is:

1. In a differential input, operational electronic amplifier comprising a dual transistor assembly including
- a pair of matched transistor chips,
- a substrate on which the chips are mounted in closely spaced, side-by-side relation,
- leads extending through said substrate and respectively connected to the active portions of said transistor chips,
- an inverted metal can telescoped over the substrate and bonded thereto with its walls spaced from said chips and leads,
- said can having an outwardly projecting flange at its lower end,
- a thermal protective unit for said transistor assembly including, in combination,
- an inverted aluminum cap telescoped over said can,
- an aluminum nut threaded onto the lower end of said cap.
- said cap and said nut having opposed inwardly projecting lips between which the flange of the can is clamped to secure the can in fixed relation to said cap, the diameter of the cap lip approximating the diameter of the can and centrally spacing the can within the cap with the walls of the can spaced from the cap, above said lip, a minimum of about .010 inch,
- the upper level of the cap lip lying below the upper surface of the substrate,
- a printed circuit board on which the nut rests and to which the transistor leads are connected, and
- potting compound encapsulating the described combination of the transistor assembly, the thermal protective unit and the printed circuit board.

2. In a differential input, operational electronic amplifier comprising a dual transistor assembly including
- a pair of matched transistor chips,
- a substrate on which the chips are mounted,
- leads extending through said substrate and respectively connected to the active portions of said transistor chips,
- an inverted can telescoped over the substrate and and bonded thereto with its walls spaced from said chips,
- said can having an outwardly projecting flange,
- a thermal protective unit for said transistor assembly including, in combination,
- a cap telescoped over said can,
- a nut threaded onto the lower end of said cap,
- said cap and nut being formed of a material having a high thermal conductivity,
- said cap and said nut having opposed inwardly projecting lips between which the flange of the can is clamped to secure the can in fixed relation to said cap with the walls of the cap in spaced relation from the can,
- the height of the cap lip being approximately no higher than the height of the substrate, and
- a printed circuit board on which the nut rests and to which the transistor leads are connected.

3. In an electronic circuit comprising a dual solid state component assembly including
- a pair of matched solid state electronic components,
- a substrate on which the components are mounted,
- leads extending through said substrate and respectively connected to the active portions of said components,
- an inverted can telescoped over the substrate and bonded thereto with its walls spaced from said components,
- said can having an outwardly projecting flange,
- a thermal protective unit for said assembly including, in combination,
- a cap telescoped over said can,
- a nut threaded onto the lower end of said cap,
- said cap and nut being formed of a material having a high thermal conductivity,
- said cap and said nut having opposed inwardly projecting lips between which the flange of the can is clamped to secure the can in fixed relation to said cap with the walls of the cap in spaced relation from the can,
- the height of the cap lip being approximately no higher than the height of the substrate, and
- a printed circuit board to which the transistor leads are connected.

No references cited.

ROBERT K. SCHAEFER, *Primary Examiner.*